(12) United States Patent
Zhu et al.

(10) Patent No.: US 9,196,583 B1
(45) Date of Patent: Nov. 24, 2015

(54) VIA MATERIAL SELECTION AND PROCESSING

(71) Applicant: QUALCOMM Incorporated, San Diego, CA (US)

(72) Inventors: John Jianhong Zhu, San Diego, CA (US); Jeffrey Junhao Xu, San Diego, CA (US); Stanley Seungchul Song, San Diego, CA (US); Kern Rim, San Diego, CA (US); Zhongze Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/274,470

(22) Filed: May 9, 2014

(51) Int. Cl.
| H01L 27/01 | (2006.01) |
| H01L 27/12 | (2006.01) |
| H01L 31/0392 | (2006.01) |
| H01L 23/522 | (2006.01) |
| H01L 23/532 | (2006.01) |
| H01L 21/768 | (2006.01) |

(52) U.S. Cl.
CPC ...... *H01L 23/5226* (2013.01); *H01L 21/76879* (2013.01); *H01L 23/5228* (2013.01); *H01L 23/53228* (2013.01); *H01L 23/53257* (2013.01)

(58) Field of Classification Search
CPC ..... H01L 21/00; H01L 21/4763; H01L 27/01; H01L 27/12; H01L 31/0392
USPC .......................................... 257/347; 438/624
See application file for complete search history.

(56) References Cited

U.S. PATENT DOCUMENTS

| 6,261,960 | B1 | 7/2001 | Yu et al. | |
| 7,160,772 | B2 | 1/2007 | Coolbaugh et al. | |
| 7,843,005 | B2 | 11/2010 | Nowak | |
| 7,999,320 | B2 | 8/2011 | Botula et al. | |
| 8,133,774 | B2 | 3/2012 | Botula et al. | |
| 2005/0285269 | A1 | 12/2005 | Cao et al. | |
| 2007/0023758 | A1* | 2/2007 | Tsurume et al. | 257/66 |
| 2007/0218685 | A1 | 9/2007 | Sivakumar et al. | |
| 2009/0130837 | A1 | 5/2009 | Huang | |
| 2009/0152724 | A1* | 6/2009 | Wang et al. | 257/751 |
| 2012/0070986 | A1 | 3/2012 | Ueki et al. | |
| 2013/0181350 | A1* | 7/2013 | Pelley et al. | 257/754 |
| 2015/0123759 | A1* | 5/2015 | Chuang et al. | 257/347 |

OTHER PUBLICATIONS

International Search Report and Written Opinion—PCT/US2015/024083—ISA/EPO—Jun. 10, 2015.

* cited by examiner

*Primary Examiner* — Phuc Dang
(74) *Attorney, Agent, or Firm* — Seyfarth Shaw LLP

(57) ABSTRACT

Semiconductor interconnects and methods for making semiconductor interconnects. An interconnect may include a first via of a first conductive material between a first conductive interconnect layer and a first middle of line (MOL) interconnect layer. The first MOL interconnect layer is on a first level. The first via is fabricated with a single damascene process. Such a semiconductor interconnect also includes a second via of a second conductive material between the first conductive interconnect layer and a second MOL interconnect layer. The second MOL interconnect layer is on a second level. The second via is fabricated with a dual damascene process. The first conductive material is different than the second conductive material.

30 Claims, 13 Drawing Sheets

VIA MATERIAL SELECTION AND PROCESSING

TECHNICAL FIELD

Aspects of the present disclosure relate to semiconductor devices, and more particularly to routing conductive layers, such as the middle of line layers, within an integrated circuit.

BACKGROUND

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. Middle of line processes include gate and terminal contact formation. Back end of line processes include forming interconnects and dielectric layers for coupling to the FEOL devices.

These interconnects may be fabricated with damascene processes using plasma-enhanced chemical vapor deposition (PECVD) deposited interlayer dielectric (ILD) materials. These interconnect layers of semiconductor circuits have become smaller and more difficult to route because of the increased density of chip design. Because some materials that are used to connect various interconnect layers have higher resistance, this may affect the timing and/or resistance properties of these "vias" or electrical paths. As an example, tungsten is often used for vias between layers. The ratio of the depth to the diameter of a via is called the aspect ratio. Tungsten is often processed in a "single damascene" (SD) process to deposit or otherwise couple the tungsten material into the via. Copper is often processed in a "dual damascene" (DD) process.

SUMMARY

A semiconductor interconnect may include a first via of a first conductive material between a first conductive interconnect layer and a first middle of line (MOL) interconnect layer. The first MOL interconnect layer is on a first level. The first via is fabricated with a single damascene process. Such a semiconductor interconnect also includes a second via of a second conductive material between the first conductive interconnect layer and a second MOL interconnect layer. The second MOL interconnect layer is on a second level. The second via is fabricated with a dual damascene process. The first conductive material is different than the second conductive material.

A method of fabricating a middle of line (MOL) interconnect may include fabricating a first via of a first conductive material. The first via is coupled to a first MOL interconnect layer on a first level. The first via is made with a single damascene process. The method also includes fabricating a second via and a first conductive interconnect layer of a second conductive material. The second via is made with a dual damascene process. The first conductive interconnect layer couples to the first via. The first conductive material is different than the second conductive material. The second via is coupled to a second MOL interconnect layer on a second level.

A semiconductor interconnect may include means for conducting current between a first conductive interconnect layer and a first middle of line (MOL) interconnect layer. The first MOL interconnect layer is on a first level. The first means is fabricated with a first conductive material in a single damascene process. The interconnect also includes means for conducting current between the first conductive interconnect layer and at least a second MOL interconnect layer. The second MOL interconnect layer is on a second level. The second means is fabricated with a second conductive material in a dual damascene process. The first conductive material is different than the second conductive material.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Various aspects of the disclosure provide techniques for routing conductive layers, such as the middle of line layers, within an integrated circuit. The process flow for semiconductor fabrication of an integrated circuit may include front-end-of-line (FEOL) processes, middle of line (MOL) processes, and back-end-of-line (BEOL) processes. It will be understood that the term "layer" includes film and is not to be construed as indicating a vertical or horizontal thickness unless otherwise stated. As described herein, the term "semiconductor substrate" may refer to a substrate of a diced wafer or may refer to the substrate of a wafer that is not diced. Similarly, the terms wafer and die may be used interchangeably unless such interchanging would tax credulity.

According to one aspect of the disclosure, a hybrid via structure and process of forming the hybrid via structure are described. In one configuration, a first material is coupled to a first interconnect layer using a single damascene process for some interconnect layers of a semiconductor device. For other interconnect layers, a dual damascene process couples a second material to a second interconnect layer. The second material may also be coupled to the first material. This aspect of the present disclosure may lower the resistance of some of the interconnections and increase the overall circuit performance. The conductive layer may also be a first conductive layer (e.g., metal one (M1)) in the semiconductor device.

Connections between conductive layers in semiconductor devices, also called "vias," are used to route signals between devices or areas of the semiconductor chip. These pathways are often created using damascene processes. A "single damascene" (SD) process is shown in FIGS. 1A-1E.

Figure 1A:
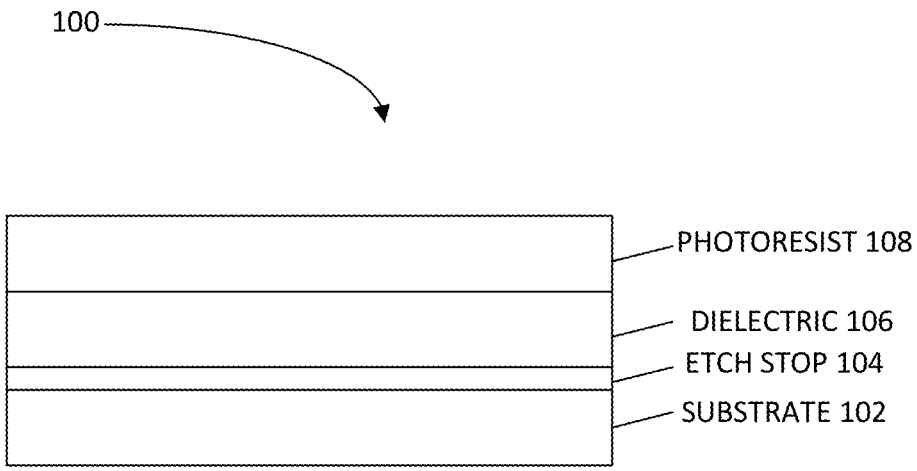
FIGS. 1A-1E illustrate a "single damascene" (SD) process in accordance with an aspect of the disclosure.

FIG. 1A illustrates a wafer 100, having a substrate 102, an etch stop layer 104, a dielectric layer 106, and a photoresist layer 108. The wafer 100 may be a die, chip, or other device without departing from the scope of the present disclosure. The dielectric layer 106 may be an oxide, such as silicon oxide, or other insulating materials, without departing from the scope of the present disclosure.

Figure 1B:
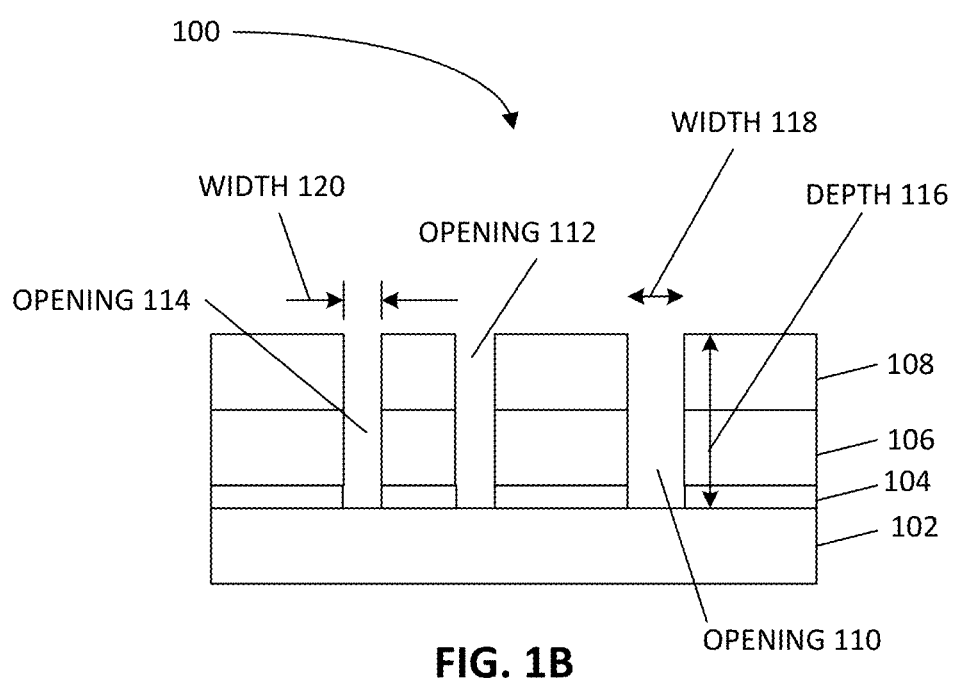

As shown in FIG. 1B, the photoresist layer 108 is selectively patterned, and openings 110, 112, and 114 are formed in the dielectric layer 106. The depth 116 of the openings 110-114 is based on the thickness of the dielectric layer 106. A width 118 of the opening 110 may be different than a width 120 of the opening 114. The ratio of the width to the depth of the opening is referred to as an "aspect ratio" of the openings 110-114. The dielectric layer 106 may be etched, using wet chemical etching, plasma etching, or other dielectric material removal techniques. The etch stop layer 104 may also be removed if desired.

Figure 1C:
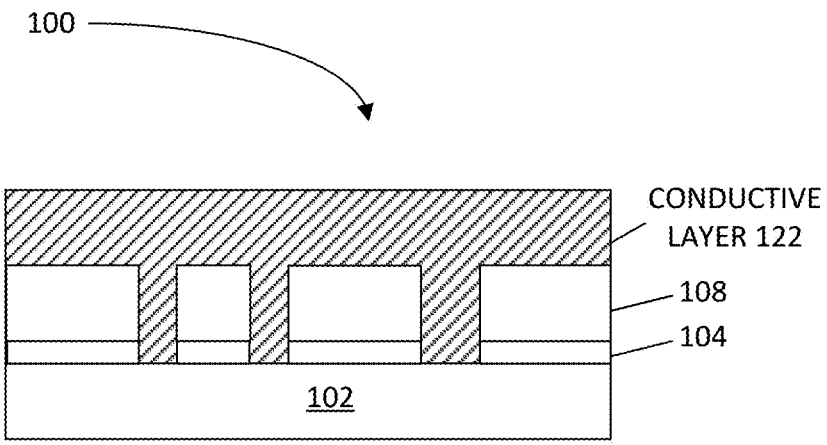

In FIG. 1C, a conductive layer 122 is added to the die 100. The conductive layer 122 is deposited in the openings 110-114, as well as on exposed portions of the dielectric layer 106. As such, the substrate 102 is electrically and/or mechanically coupled to the conductive layer 122 through the openings 110-114. The conductive layer may be deposited using an electro-deposition or electroplating process, or may be sputtered or otherwise coupled to the die 100, such that the openings 110-114 are substantially filled with the conductive layer 122 material. The openings 110-114 may be referred to as "vias" or "interconnection paths" once the conductive layer 122 is deposited.

The conductive layer 122 may include a barrier layer to line the openings 110-122 and surfaces of the dielectric layer 106. The barrier layer portion may be tantalum, tantalum nitride, titanium nitride, titanium-tungsten, or other materials. The barrier layer portion of the conductive layer 122 reduces diffusion of material from the conductive layer to the dielectric layer 106 and/or the substrate 102. The conductive layer 122 may also include a seed layer to assist in the mechanical and/or electrical coupling between the conductive layer 122 and the substrate 102 within the openings 110-114.

Figure 1D:
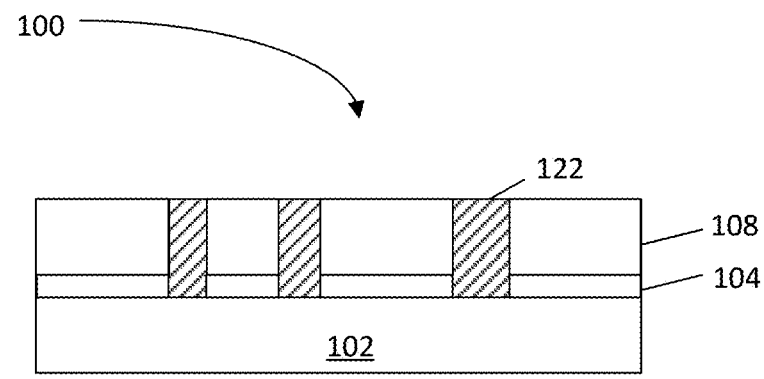
Figure 1E:
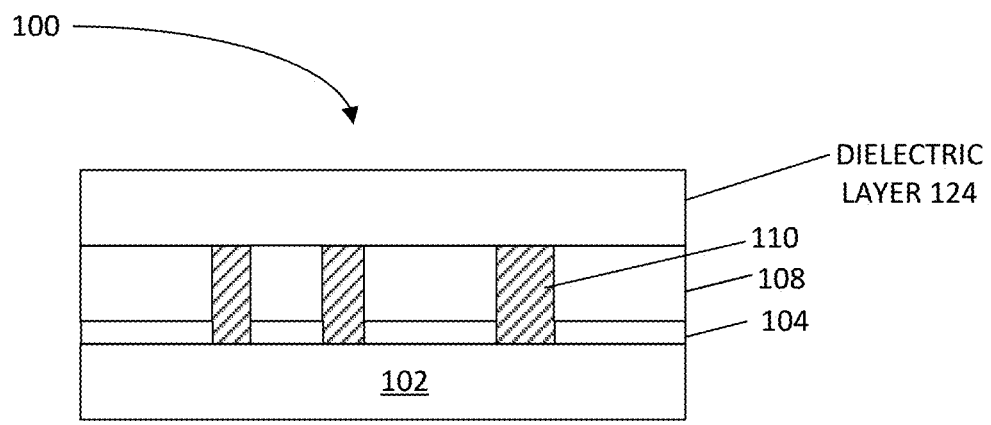

In FIG. 1D, portions of the conductive layer 122 are removed, such that the conductive layer 122 and the dielectric layer 106 become planar. This process may be referred to as chemical mechanical planarization (CMP), although the planarization may be performed using other techniques without departing from the scope of the present disclosure. FIG. 1E illustrates another dielectric layer 124 on the die 100 which encapsulates the conductive layer 122.

For some openings 110-114, the conductive layer 122 may be tungsten or aluminum. For other openings 110-114, other materials, such as copper, may be more desirable. Copper has a lower resistance than tungsten. Nevertheless, copper may not be suitable for vias having an aspect ratio greater than two (e.g., the width 118 is half as large as the depth 116). Copper vias of certain aspect ratios also may be applied or coupled to a lower interconnect layer when forming a first conductive layer, such as the "metal one (M1)" layer.

FIGS. 2A-2K illustrate a dual damascene process. Copper can be coupled to a semiconductor chip using a "dual damascene" process.

Figure 2A:
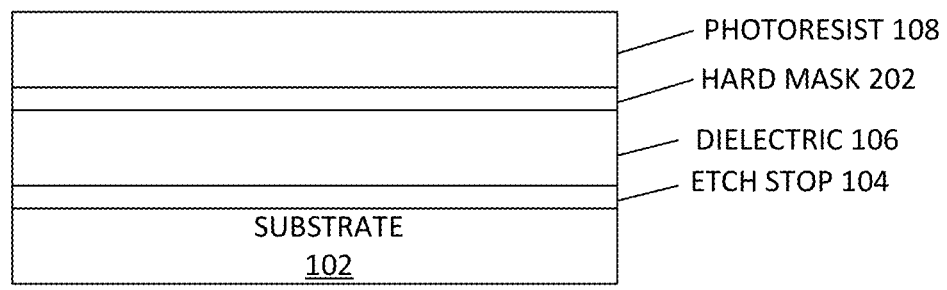
FIGS. 2A-2K illustrates a "dual damascene" (DD) process in accordance with an aspect of the disclosure.
Figure 2B:
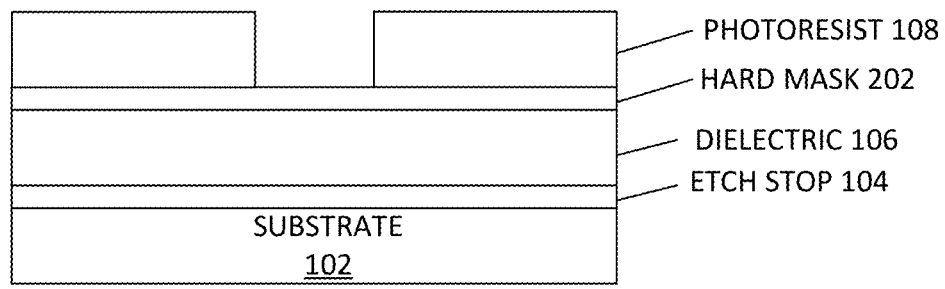

FIG. 2A illustrates a wafer 200, which may also be a die or other device, including a substrate 102, an etch stop layer 104, a dielectric layer 106, a hard mask layer 202, a and a photoresist layer 108. In a similar fashion to FIGS. 1A-1E, the photoresist layer 108 is patterned as shown in FIG. 2B.

Figure 2C:
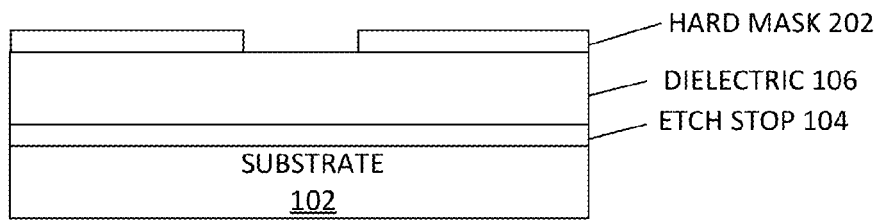

FIG. 2C illustrates the transfer of the photoresist layer 108 pattern to the hard mask layer 202. This portion of the dual damascene process may be known as a hard mask etch or a trench etch in some designs.

Figure 2D:
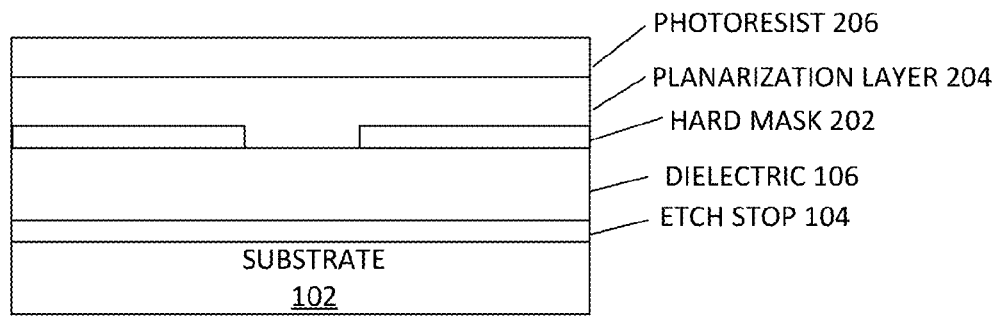
Figure 2E:
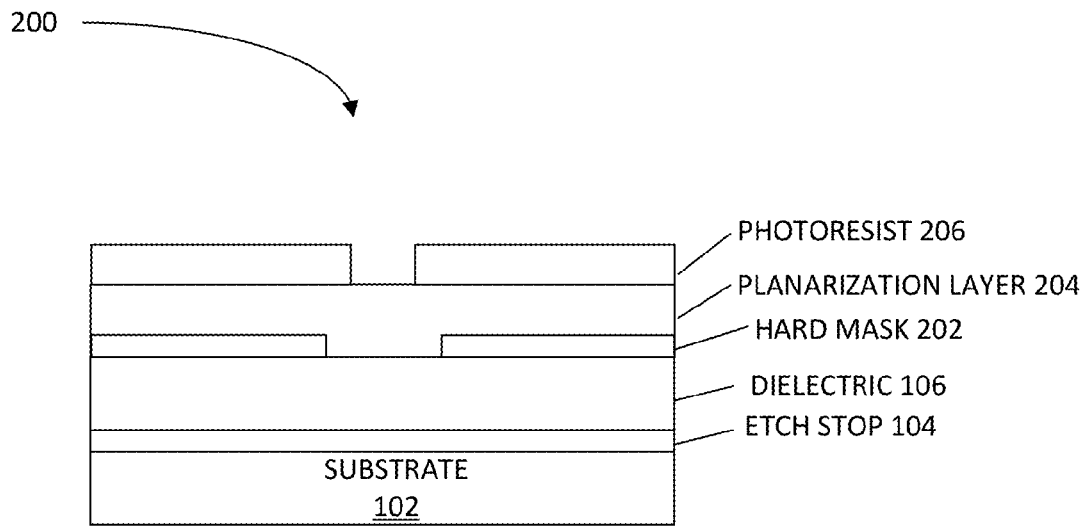
Figure 2F:
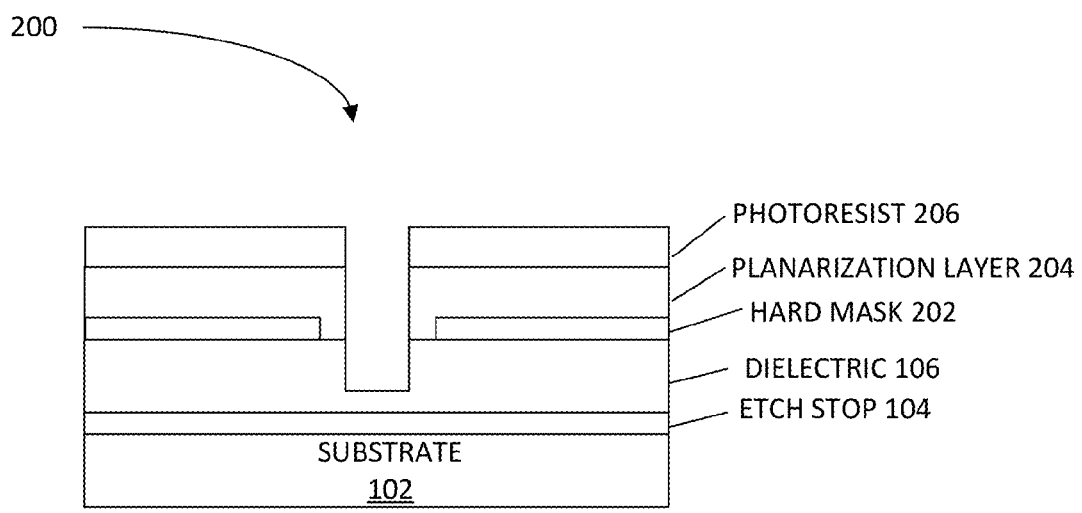

FIG. 2D illustrates a planarization layer 204 and a second photoresist layer 206 being applied to the wafer 200. In the dual damascene process, the planarization layer 204 is placed within the trench etch to protect the etched portion of the hard mask layer 202. FIG. 2E illustrates a second pattern being transferred to the second photoresist layer 206, which may be referred to as patterning a via. FIG. 2F illustrates a partial etch of the second pattern, i.e., the via pattern, through the planarization layer 204, hard mask layer 202, and at least a part of the dielectric layer 106.

Figure 2G:
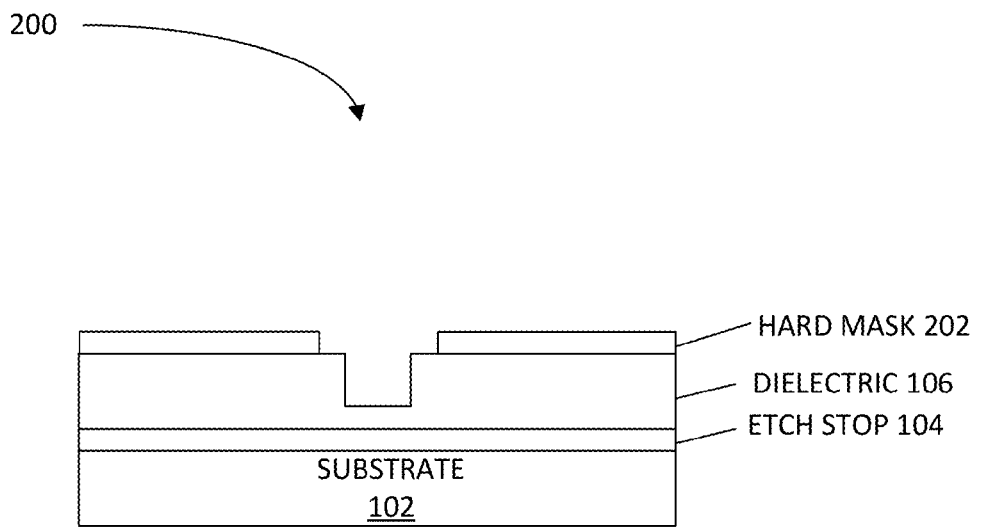
Figure 2H:
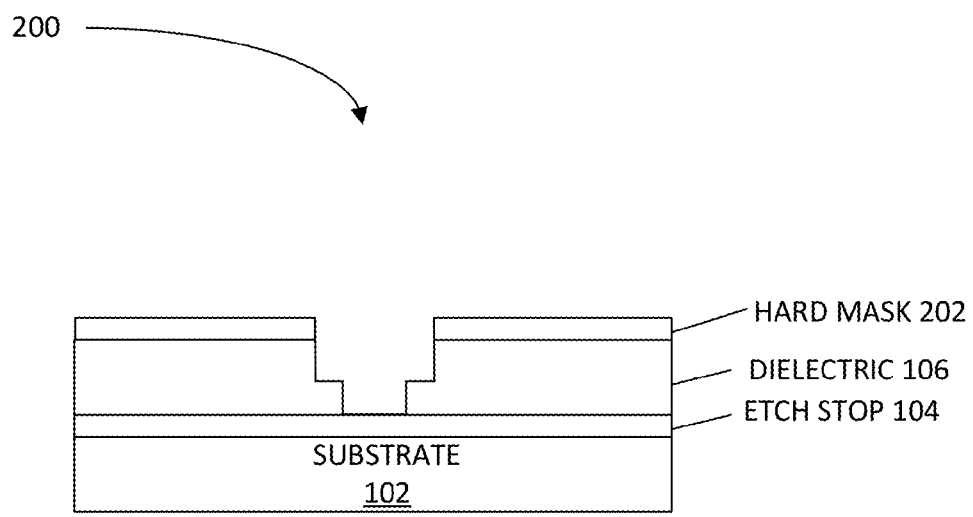

FIG. 2G illustrates removal of the second photoresist layer 206 and the planarization layer 204 from the wafer 200. FIG. 2H illustrates another etching of the dielectric layer 106, which defines the trench portion of the interconnect in the dielectric layer 106. The via portion of the etch in the dielectric layer 1106 is also extended through the dielectric layer 106 to the etch stop layer 104.

Figure 2I:
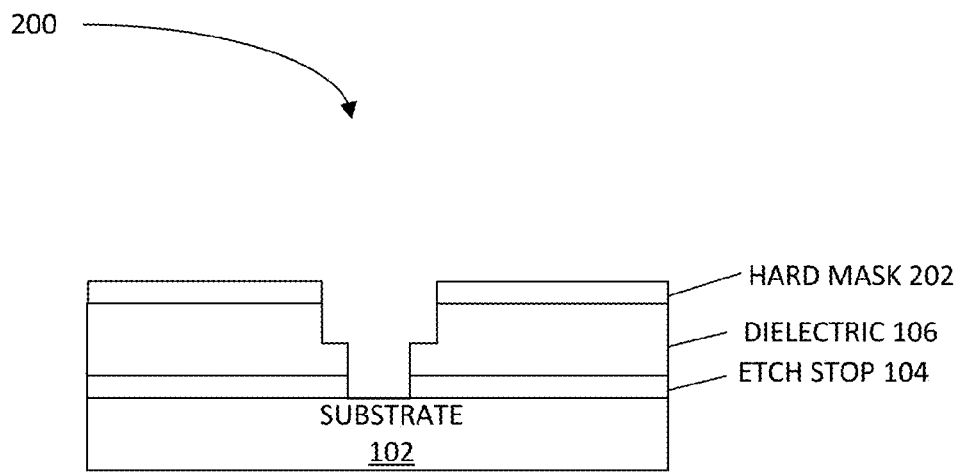
Figure 2J:
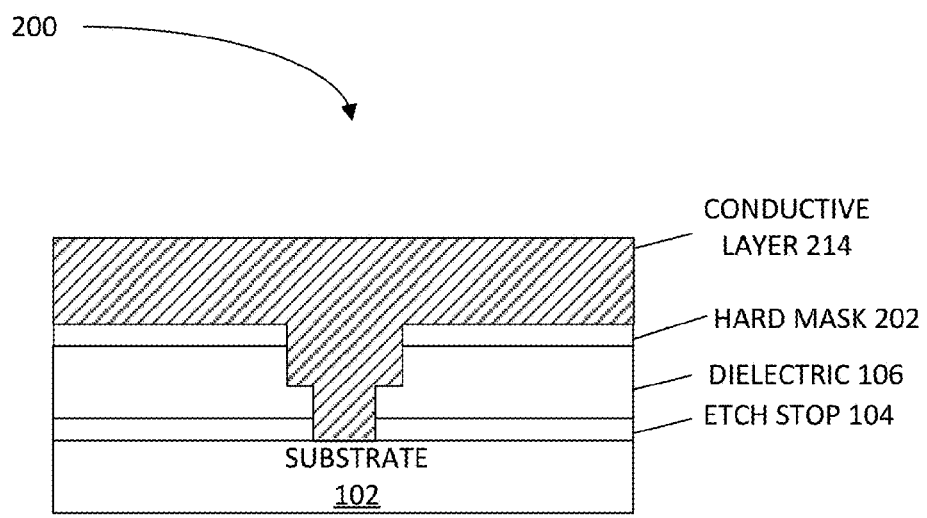
Figure 2K:
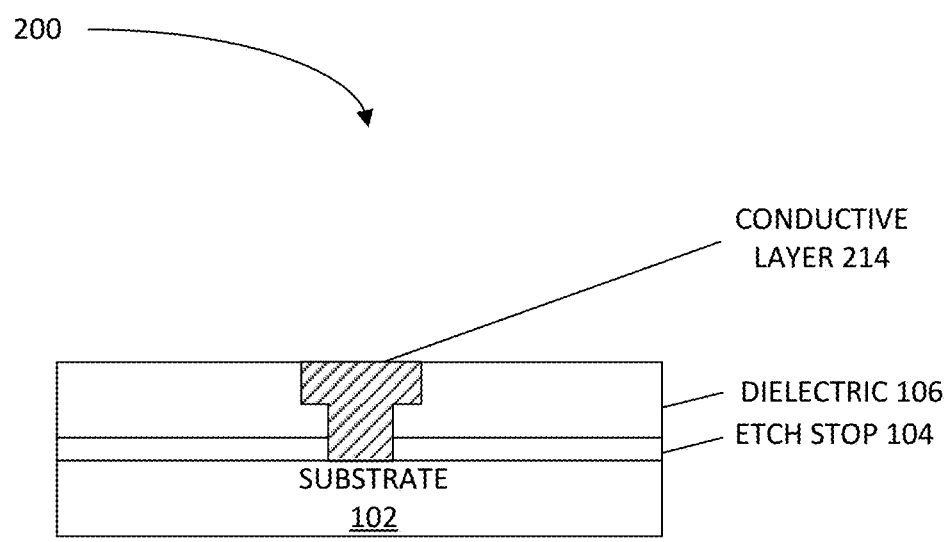

FIG. 2I illustrates opening the bottom of the via portion of the interconnect by etching the exposed portion of the etch stop layer 104. This etch now exposes the substrate 102. FIG. 2J illustrates deposition of a conductive layer 214 within the etched volume in the etch stop layer 104, the dielectric layer 106, and the hard mask layer 202. The conductive layer 214 may be processed similarly to the conductive layer 122 described in FIGS. 1A-1E. FIG. 2J illustrates removal of portions of the conductive layer 214 and the hard mask layer 202. This removal may be performed through chemical-mechanical planarization (CMP), etching, or other processes.

In FIGS. 2A-2K, a "trench first with hard mask" (TFHM) approach to the dual damascene process is described. Although the TFHM process is described, other dual damascene processes, such as "trench first then via" or "via first then trench" processes, or other dual damascene processes, may be used without departing from the scope of the present disclosure.

Although the processes shown in FIGS. 1A-1F and 2A-2K illustrate the conductive layers reaching the substrate 102, the conductive layers created using damascene processes may be used within the middle-of-line, or from the back end of line into the middle of line interconnect layers.

Figure 3:
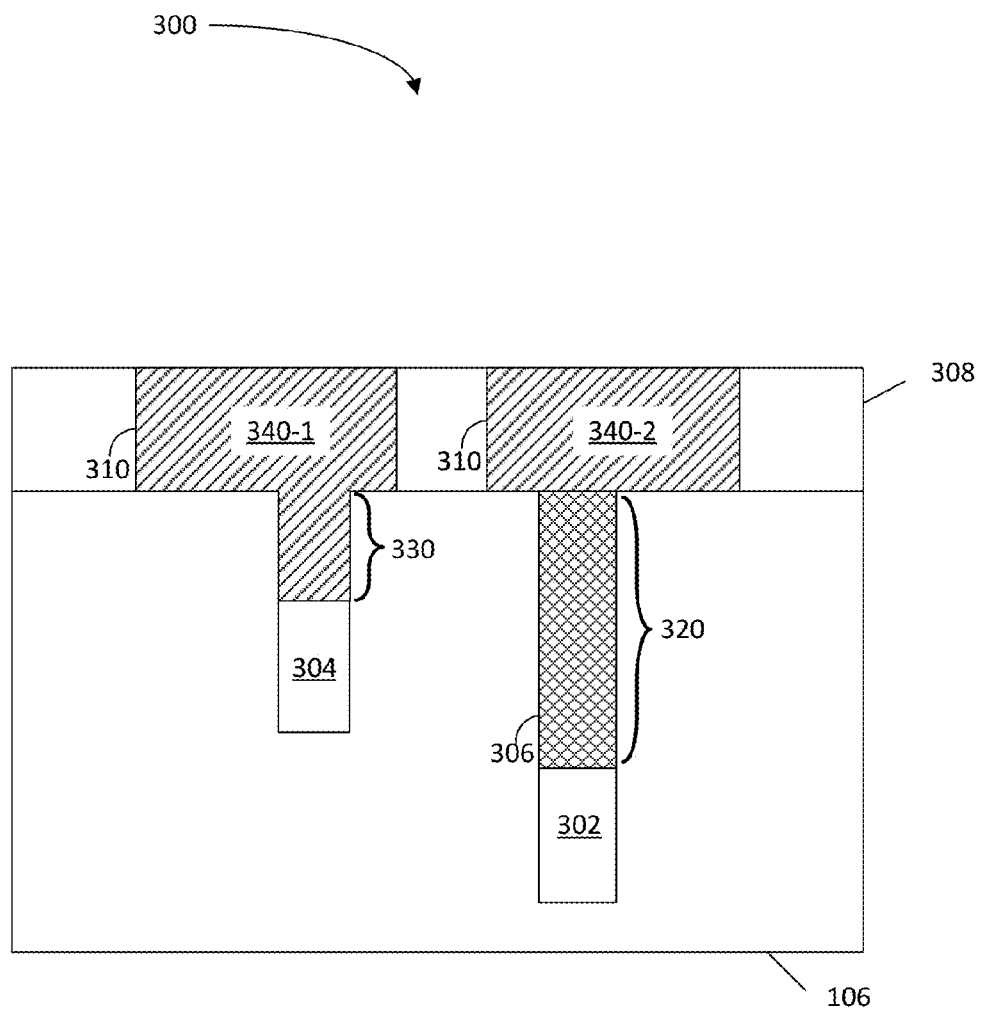
FIG. 3 illustrates two interconnect layers at different distances from a surface of a semiconductor chip.

FIG. 3 illustrates layer interconnects in accordance with an aspect of the disclosure. A device 300 includes a dielectric layer 106 in which a first MOL interconnect layer 302 and a second MOL interconnect layer 304 are provided. To access the first MOL interconnect layer 302, a single damascene process (similar to that shown in FIGS. 1A-1F) may be used. A first via 320 is opened, and filled with a first conductive material 306. The first conductive material 306 may be a material that can be deposited or otherwise placed into the via 320 with a large aspect ratio (e.g., the depth of the via is more than two times the width of the via).

To access the second MOL interconnect layer 304, a dual damascene process (similar to that shown in FIGS. 2A-2J) may be used. Further, this process may also be used to access the first conductive material 306 of the first via 320. A dielectric layer 308 is patterned and the openings are filled with a second conductive material 310 to form a second via 330 and a first conductive interconnect layer 340 (340-1, 340-2). The first conductive interconnect layer 340-1 accesses the second MOL interconnect layer 304 through the second via 330. In this configuration, first conductive interconnect layer 340-2 of the second conductive material 310 accesses the first MOL interconnect layer 302 through the first via 330 of the first conductive material 306. The second conductive material 310 may be a different material than the first conductive material 306, because the openings in the dielectric layer 308 may have different aspect ratios than that of dielectric layer 106. Further, the second conductive material 310 may be chosen based on material properties, such as conductivity, or desired interactions/desired non-interactions with other layers within the device 300.

As shown in FIG. 3, the dual damascene process used to access the first MOL interconnect layer 302 also acts as a portion of the single damascene process used to access the second MOL interconnect layer 304. As such, different materials may access different interconnect layers based on different variables. The aspect ratio of the via may specify the use of certain materials (e.g., tungsten). The timing of the circuit accessed through the first conductive material 306 and the second conductive material 310 of the first and second vias 320 and 330 may be crucial. As a result, the size of the first and second vias 320 and 330, and the material characteristics of the first and second conductive material accessing that particular first MOL interconnect layer 302 can be selected through this aspect of the present disclosure.

As such, one aspect of the present disclosure describes a hybrid via structure and process of forming the hybrid via structure. For some interconnect layers 302 on a device 300, a first conductive material 306 is depositing to form a first via 320 to a first MOL interconnect layer 302 using a single damascene process. For a second MOL interconnect layer 304, a dual damascene process is used to deposit a second conductive material 310 to form a second via 340 to the second MOL interconnect layer 304. The second conductive material 310 may also be coupled to the first conductive material 306. This aspect of the present disclosure may lower the resistance of some of the interconnections, which may increase the overall circuit performance. The first conductive interconnect layer 340 may also be a first conductive layer (e.g., metal one (M1)) in the device 300.

Figure 4:
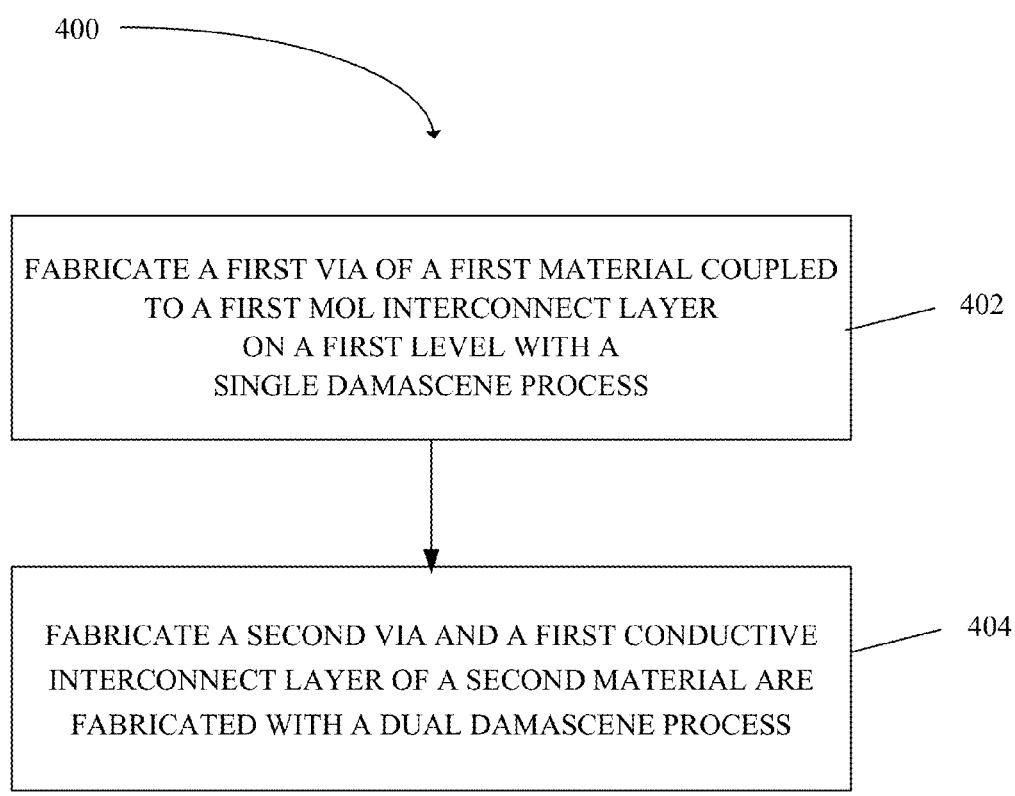
FIG. 4 is a process flow diagram illustrating a method for fabricating middle of line (MOL) layers according to an aspect of the present disclosure.

FIG. 4 is a process flow diagram illustrating a method 400 for fabricating middle of line (MOL) layers according to an aspect of the present disclosure. In block 402, a first via of a first material, coupled to a first MOL interconnect layer on a first level, is fabricated in a single damascene process. For example, as shown in FIG. 3, the first via 320 is opened, and filled with a first conductive material 306.

In block 404, a second via and a first conductive layer of a second material are fabricated with a dual damascene process. For example, as shown in FIG. 3, a dielectric layer 308 is patterned and the openings are filled with the second conductive material 310 to form the second via 330 to the second MOL interconnect layer 304. The second conductive material 310 of the first conductive interconnect layer 340-2 also accesses the first MOL interconnect layer 302 through the first via 320 of the first conductive material 306. The first conductive material 306 may be different than the second conductive material 310. For example, the second conductive material 310 may be a different material than the first conductive material 306, because the openings in the dielectric layer 308 may have different aspect ratios than those of dielectric layer 106. In this example, the second via 330 of the second conductive material 310 couples the first conductive interconnect layer 340-1 to the second MOL interconnect layer 304.

According to a further aspect of the present disclosure, a semiconductor interconnect is described. The interconnect includes means for conducting current between a first conductive interconnect layer and at least a first middle of line (MOL) interconnect layer on a first level fabricated with a first conductive material in a single damascene process. The first means may be the via 320 shown in FIG. 3. The device also includes means for conducting current between the first conductive interconnect layer and at least a second MOL interconnect layer on a second level fabricated with a second conductive material in a dual damascene process, the first conductive material differing from the second conductive material. The second means may be the via 330 shown in FIG. 3. In another aspect, the aforementioned means may be any module or any apparatus configured to perform the functions recited by the aforementioned means.

Figure 5:
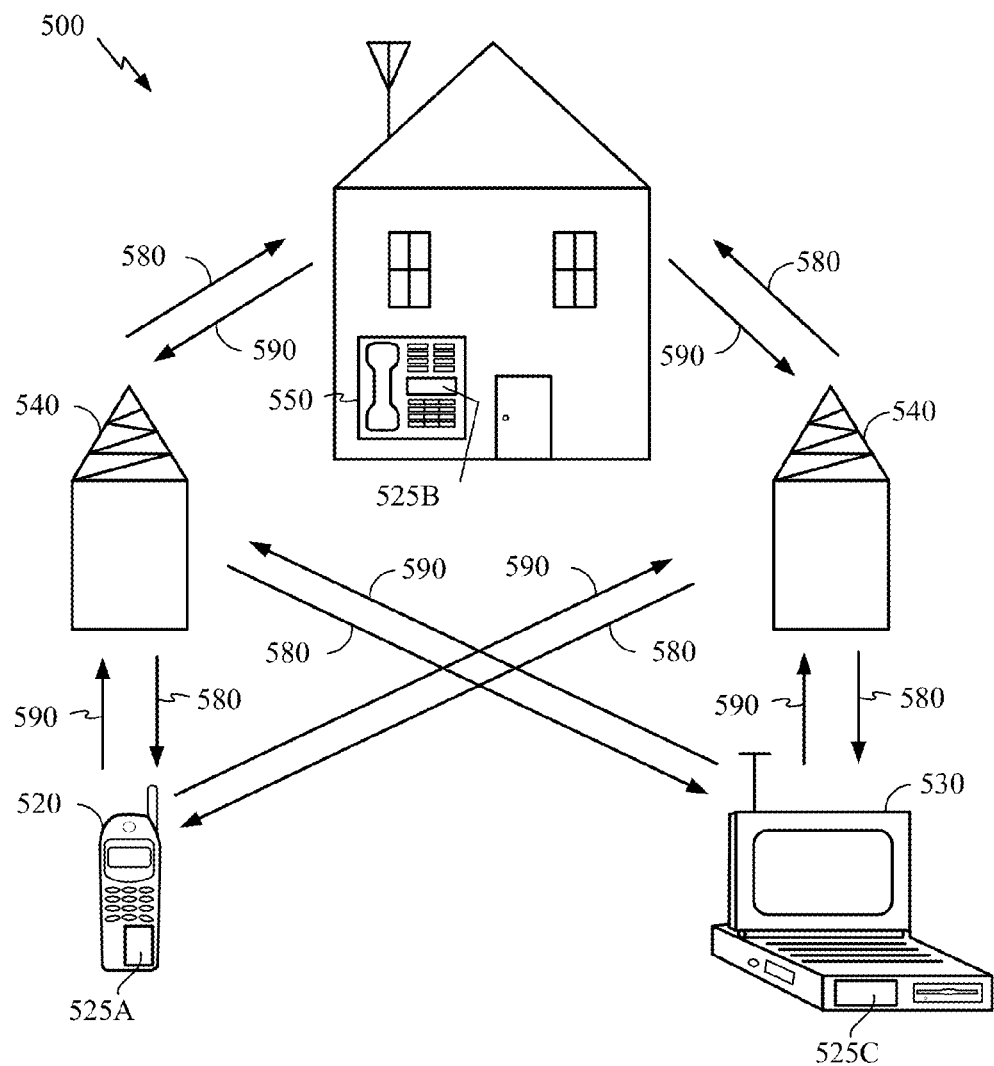
FIG. 5 is a block diagram showing an exemplary wireless communication system in which an aspect of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed devices. It will be recognized that other devices may also include the disclosed devices, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed devices.

Figure 6:
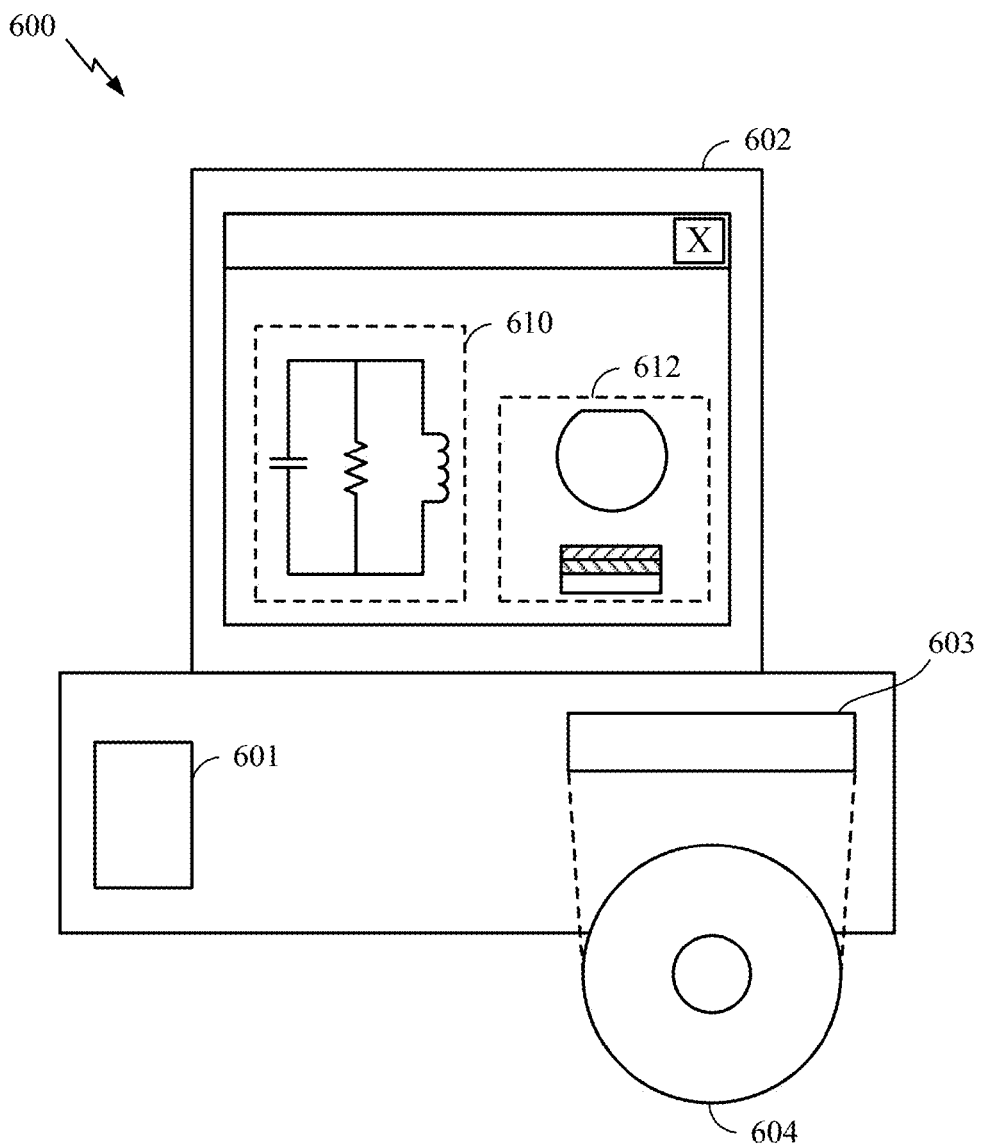
FIG. 6 is a block diagram illustrating a design workstation used for circuit, layout, and logic design of a semiconductor component, such as the devices disclosed above.

FIG. 6 is a block diagram illustrating a design workstation used for circuit, layout, and logic design of a semiconductor component, such as the devices disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a device in accordance with an aspect of the present disclosure. A storage medium 604 is provided for tangibly storing the design of the circuit 610 or the semiconductor component 612. The design of the circuit 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A semiconductor device, comprising:
    a first via of a first conductive material between a first conductive interconnect layer and at least a first middle of line (MOL) interconnect layer on a first level fabricated with a single damascene process;
    a second via of a second conductive material between the first conductive interconnect layer and at least a second MOL interconnect layer on a second level fabricated with a dual damascene process, the first conductive material differing from the second conductive material; and
    a circuit coupled to one of the first MOL interconnect layer and the second MOL interconnect layer, the first MOL interconnect layer and the second MOL interconnect layer disposed between the circuit and the first conductive interconnect layer.

2. The semiconductor device of claim 1, in which a length of the first via is different from the length of the second via.

3. The semiconductor device of claim 1, in which a resistance of the first via is different than the resistance of the second via.

4. The semiconductor device of claim 1, in which the first conductive material is tungsten and the second conductive material is copper.

5. The semiconductor device of claim 1 integrated into a mobile phone, a set top box, a music player, a video player, an entertainment unit, a navigation device, a computer, a hand-held personal communication systems (PCS) unit, a portable data unit, and/or a fixed location data unit.

6. A semiconductor device, comprising:
    a first via of a first conductive material between a first conductive interconnect layer and at least a first middle of line (MOL) interconnect layer on a first level fabricated with a single damascene process; and
    a second via of a second conductive material between the first conductive interconnect layer and at least a second MOL interconnect layer on a second level fabricated with a dual damascene process, the first conductive material differing from the second conductive material, in which at least one of the first conductive material and the second conductive material is selected based at least in part on an aspect ratio of the first via.

7. A semiconductor device, comprising:
    a first via of a first conductive material between a first conductive interconnect layer and at least a first middle of line (MOL) interconnect layer on a first level fabricated with a single damascene process; and
    a second via of a second conductive material between the first conductive interconnect layer and at least a second MOL interconnect layer on a second level fabricated with a dual damascene process, the first conductive material differing from the second conductive material, in which at least one of the first conductive material and the second conductive material is selected based at least in part on a circuit coupled to one of the first MOL interconnect layer and the second MOL interconnect layer.

8. A method of fabricating a middle of line (MOL) semiconductor device, comprising:
    fabricating a first via of a first conductive material coupled to a first MOL interconnect layer on a first level in a single damascene process; and
    fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level, in which a circuit is coupled to one of the first MOL interconnect layer and the second MOL interconnect layer, the first MOL interconnect layer and the second MOL interconnect layer disposed between the circuit and the first conductive interconnect layer.

9. The method of claim 8, in which a length of the first via is different from the length of the second via.

10. The method of claim 8, in which a resistance of the first via is different than the resistance of the second via.

11. The method of claim 8, in which the first conductive material is tungsten and the second conductive material is copper.

12. A method of fabricating a middle of line (MOL) interconnect, comprising:
    fabricating a first via of a first conductive material coupled to a first MOL interconnect layer on a first level in a single damascene process;
    fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level; and selecting the second conductive material based at least in part on an aspect ratio of the second via.

13. A method of fabricating a middle of line (MOL) interconnect, comprising:

fabricating a first via of a first conductive material coupled to a first MOL interconnect layer on a first level in a single damascene process;

fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level; and selecting the second conductive material based at least in part on a desired resistance between the first conductive interconnect layer and the second MOL interconnect layer.

14. A method of fabricating a middle of line (MOL) interconnect, comprising:

fabricating a first via of a first conductive material coupled to a first MOL interconnect layer on a first level in a single damascene process; and fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level, in which at least one of the first conductive material and the second conductive material is selected based at least in part on an aspect ratio of the first via.

15. A method of fabricating a middle of line (MOL) semiconductor device, comprising:

fabricating a first via of a first conductive material coupled to a first MOL interconnect layer on a first level in a single damascene process; and fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level, in which at least one of the first conductive material and the second conductive material is selected based at least in part on a circuit coupled to one of the first MOL interconnect layer and the second MOL interconnect layer.

16. A method of fabricating a middle of line (MOL) semiconductor device, comprising the steps of:

the step for fabricating a first via of a first conductive material coupled to a first MOL interconnect layer on a first level in a single damascene process; and the step for fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level, in which a circuit is coupled to one of the first MOL interconnect layer and the second MOL interconnect layer, the first MOL interconnect layer and the second MOL interconnect layer disposed between the circuit and the first conductive interconnect layer.

17. The method of claim 16, in which a length of the first via is different from the length of the second via.

18. The method of claim 16, in which a resistance of the first via is different than the resistance of the second via.

19. The method of claim 16, in which the MOL interconnect is integrated into a mobile phone, a set top box, a music player, a video player, an entertainment unit, a navigation device, a computer, a hand-held personal communication systems (PCS) unit, a portable data unit, and/or a fixed location data unit.

20. A method of fabricating a middle of line (MOL) interconnect, comprising:

the step for fabricating a first via of a first conductive material coupled to a first MOL interconnect layer on a first level in a single damascene process;

the step for fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level; and the step for selecting the second conductive material based at least in part on an aspect ratio of the second via.

21. A method of fabricating a middle of line (MOL) interconnect, comprising steps of:

the step for fabricating a first via of a first conductive material coupled to a first MOL interconnect layer on a first level in a single damascene process;

the step for fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level; and the step for selecting the second conductive material based at least in part on a desired resistance between the first conductive interconnect layer and the second MOL interconnect layer.

22. A method of fabricating a middle of line (MOL) interconnect, comprising steps of:

the step for fabricating a first via of a first conductive material coupled to a first MOL interconnect layer on a first level in a single damascene process; and the step for fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level, in which at least one of the first conductive material and the second conductive material is selected based at least in part on an aspect ratio of the first via.

23. A method of fabricating a middle of line (MOL) interconnect, comprising steps of:

the step for fabricating a first via of a first conductive material coupled to a first MOL interconnect layer on a first level in a single damascene process; and the step for fabricating a second via and a first conductive interconnect layer of a second conductive material with a dual damascene process, the first conductive interconnect layer coupling to the first via, the first conductive material differing from the second conductive material, the second via coupled to a second MOL interconnect layer on a second level, in which at least one of the first conductive material and the second conductive material is selected based at least in part on a circuit coupled to one of the first MOL interconnect layer and the second MOL interconnect layer.

24. A semiconductor interconnect, comprising:

means for conducting current between a first conductive interconnect layer and at least a first middle of line (MOL) interconnect layer on a first level fabricated with a first conductive material in a single damascene process; and means for conducting current between the first conductive interconnect layer and at least a second MOL interconnect layer on a second level fabricated with a second conductive material in a dual damascene process, the first conductive material differing from the second conductive material, in which a circuit is coupled to one of the first MOL interconnect layer and the second MOL interconnect layer, the first MOL interconnect layer and the second MOL interconnect layer disposed between the circuit and the first conductive interconnect layer.

25. The semiconductor interconnect of claim 24, in which a length of the first means is different from the length of the second means.

26. The semiconductor interconnect of claim 24, in which a resistance of the first means is different than the resistance of the second means.

27. The semiconductor interconnect of claim 24, in which the first conductive material is tungsten and the second conductive material is copper.

28. The semiconductor interconnect of claim 24 integrated into a mobile phone, a set top box, a music player, a video player, an entertainment unit, a navigation device, a computer, a hand-held personal communication systems (PCS) unit, a portable data unit, and/or a fixed location data unit.

29. A semiconductor interconnect, comprising:

means for conducting current between a first conductive interconnect layer and at least a first middle of line (MOL) interconnect layer on a first level fabricated with a first conductive material in a single damascene process; and means for conducting current between the first conductive interconnect layer and at least a second MOL interconnect layer on a second level fabricated with a second conductive material in a dual damascene process, the first conductive material differing from the second conductive material, in which at least one of the first conductive material and the second conductive material is selected based at least in part on an aspect ratio of the first means.

30. A semiconductor interconnect, comprising:

means for conducting current between a first conductive interconnect layer and at least a first middle of line (MOL) interconnect layer on a first level fabricated with a first conductive material in a single damascene process; and means for conducting current between the first conductive interconnect layer and at least a second MOL interconnect layer on a second level fabricated with a second conductive material in a dual damascene process, the first conductive material differing from the second conductive material, in which at least one of the first conductive material and the second conductive material is selected based at least in part on a circuit coupled to one of the first MOL interconnect layer and the second MOL interconnect layer.

* * * * *